US009722116B2

(12) United States Patent
Bae et al.

(10) Patent No.: US 9,722,116 B2
(45) Date of Patent: Aug. 1, 2017

(54) SOLAR CELL APPARATUS

(71) Applicant: LG INNOTEK CO., LTD., Seoul (KR)

(72) Inventors: Do Won Bae, Seoul (KR); Se Han Kwon, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 502 days.

(21) Appl. No.: 13/688,984

(22) Filed: Nov. 29, 2012

(65) Prior Publication Data

US 2013/0133724 A1 May 30, 2013

(30) Foreign Application Priority Data

Nov. 29, 2011 (KR) ........................ 10-2011-0126232

(51) Int. Cl.
*H01L 31/048* (2014.01)

(52) U.S. Cl.
CPC ...... *H01L 31/0481* (2013.01); *H01L 31/0488* (2013.01); *Y02E 10/50* (2013.01)

(58) Field of Classification Search
CPC ............... H01L 31/048; H01L 31/0481; H01L 31/0487; H01L 31/0488; Y02E 10/50
USPC ......................................... 136/244, 251, 259
See application file for complete search history.

(56) References Cited

U.S. PATENT DOCUMENTS

2002/0014262 A1* 2/2002 Matsushita .......... G08B 13/128 136/244
2005/0161075 A1 7/2005 Ogawa et al.
2008/0023063 A1* 1/2008 Hayes et al. .................. 136/251
2010/0275992 A1 11/2010 Watanabe
2011/0155245 A1* 6/2011 Hsiao .................... H01L 31/048 136/261
2012/0240983 A1 9/2012 Lee et al.

FOREIGN PATENT DOCUMENTS

JP H04130457 U 11/1992
JP 2006310680 A 11/2006
JP 2007123725 A 5/2007
JP 2008047614 A 2/2008
JP 2009-188357 A 8/2009
JP 2009188357 A * 8/2009
JP 2009277891 A 11/2009
JP 2010-003860 A 1/2010
WO WO-2009091068 A1 7/2009
WO WO-2011-053024 A2 5/2011

OTHER PUBLICATIONS

Office Action dated Dec. 31, 2014 in Chinese Application No. 201210499777.8.
Office Action dated Jul. 29, 2013 in Korean Application No. 10-2011-0126232, filed Nov. 29, 2011.
Office Action dated Oct. 4, 2016 in Japanese Application No. 2012260646.

* cited by examiner

*Primary Examiner* — Matthew Martin
*Assistant Examiner* — Dujuan Horton
(74) *Attorney, Agent, or Firm* — Saliwanchik, Lloyd & Eisenschenk

(57) ABSTRACT

Disclosed is a solar cell apparatus. The solar cell apparatus includes a solar cell panel; a protective substrate formed on the solar cell panel such that a step difference is formed between the protective substrate and the solar cell panel; and a sealing member at a lateral side of the solar cell panel and on a bottom surface of the protective substrate.

5 Claims, 4 Drawing Sheets

440 115 200 420 300 400 120 100 110 112 410 111 500

SOLAR CELL APPARATUS

CROSS-REFERENCE TO RELATED APPLICATION

This application claims the benefit under 35 U.S.C. §119 of Korean Patent Application No. 10-2011-0126232, filed Nov. 29, 2011, which is hereby incorporated by reference in its entirety.

BACKGROUND

The embodiment relates to a solar cell apparatus.

A solar cell apparatus converts solar light into electric energy and includes a solar cell panel, a diode and a frame.

The solar cell panel has a plate shape. For instance, the solar cell panel has a rectangular plate shape. The solar cell panel is disposed inside the frame. Four lateral sides of the solar cell panel are disposed inside the frame.

The solar cell panel receives solar cell and converts the solar cell into electric energy. The solar cell panel includes a plurality of solar cells. In addition, the solar cell panel may further include a substrate, a film or protective glass for protecting the solar cells.

The solar cell panel includes a bus bar connected to the solar cells. The bus bar extends from a top surface of an outermost solar cell and is connected to a wire.

The diode is connected with the solar cell panel in parallel to the solar cell panel. Current is selectively applied to the diode. That is, when the performance of the solar cell panel is degraded, the current flows through the diode. Thus, the short of the solar cell apparatus according to the embodiment can be inhibited. In addition, the solar cell apparatus may further includes a wire connected to the diode and the solar cell panel. The wire connects adjacent solar cell panels with each other.

The frame receives the solar cell panel therein. The frame can be formed by using a metal. The frame is disposed at a lateral side of the solar cell panel. The frame receives the lateral side of the solar cell panel. In addition, the frame may be divided into a plurality of sub-frames. At this time, the sub-frames are connected with each other.

The solar cell apparatus is installed in the outdoor field to convert the solar cell into the electric energy. In particular, the solar cell apparatus may be exposed to harsh environment for a long time, such as snow or rain.

Therefore, the solar cells of the solar cell panel may be damaged by moisture or oxygen, so that the photoelectric conversion efficiency may be degraded. To solve the above problem, various studies and research have been performed to improve the sealing performance of the solar cell panel.

The technology related to the solar cell apparatus is disclosed in Korean Unexamined Patent Publication No. 10-2009-0059529, etc.

BRIEF SUMMARY

The embodiment provides a solar cell apparatus having the improve reliability and durability as well as improved efficiency.

A solar cell apparatus according to the embodiment includes a solar cell panel; a protective substrate formed on the solar cell panel such that a step difference is formed between the protective substrate and the solar cell panel; and a sealing member at a lateral side of the solar cell panel and on a bottom surface of the protective substrate.

A solar cell apparatus according to the embodiment includes a protective substrate including a central region and an outer region surrounding the central region; a solar cell panel disposed in the central region at a bottom surface of the protective substrate; and a sealing member surrounding a lateral side of the solar cell panel and disposed in the outer region.

A solar cell apparatus according to the embodiment includes a protective substrate; a solar cell panel under the protective substrate; a buffer sheet interposed between the protective substrate and the solar cell panel; and a sealing member disposed at a lateral side of the solar cell panel, on a bottom surface of the protective substrate and between the solar cell panel and the protective substrate, wherein an outer portion of the solar cell panel is located inward with respect to an outer portion of the protective substrate, and an outer portion of the buffer sheet is located inward with respect to the outer portion of the solar cell panel.

As described above, the solar cell apparatus according to the embodiment includes the sealing ember disposed at a bottom surface of the protective substrate and a lateral side of the solar cell panel. In addition, the sealing member can be disposed in the space between the protective substrate and the solar cell panel.

Thus, the route of impurities, such as moisture, penetrating between the protective substrate and the solar cell panel may be increased corresponding to the lateral side of the solar cell panel and the bottom surface of the protective substrate where the sealing member is disposed.

That is, a contact area between the sealing member and the solar cell panel may be increased, and a contact area between the protective substrate and the sealing member is increased. Thus, the sealing member can effectively seal the space between the solar cell panel and the protective substrate. That is, the sealing member, together with the protective substrate, can effectively seal the solar cells of the solar cell panel.

DETAILED DESCRIPTION

Figure 1:
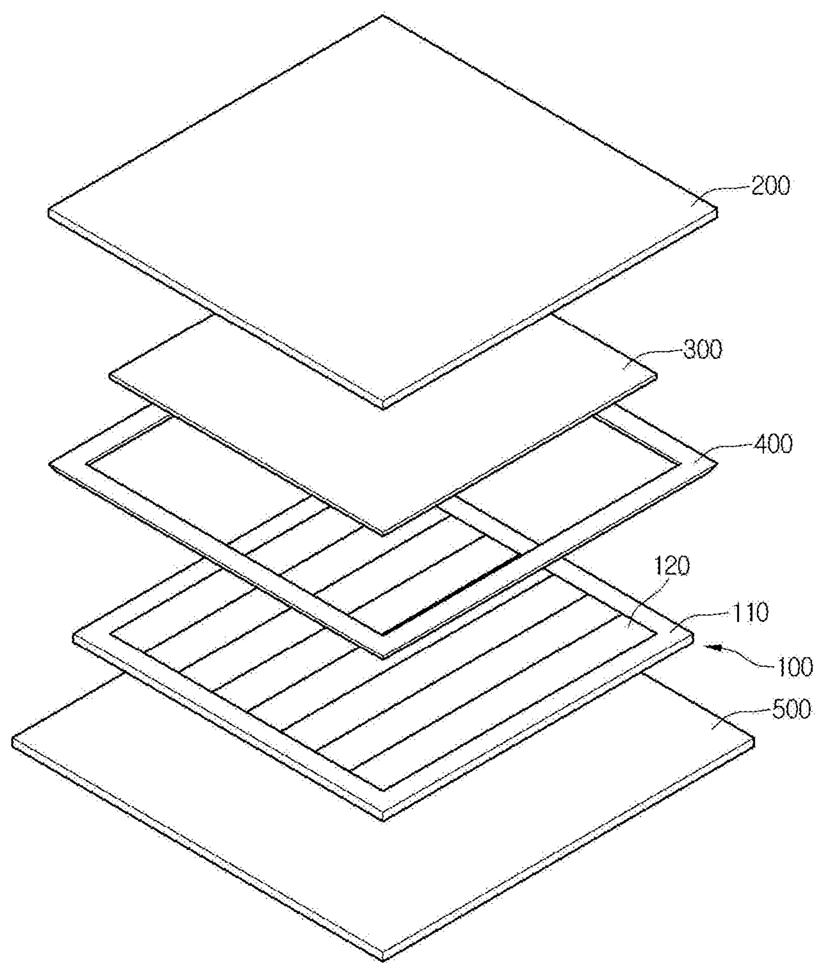
FIG. 1 is an exploded perspective view of a solar cell apparatus according to the embodiment.

In the description of the embodiments, it will be understood that when a panel, a bar, a frame, a substrate, a groove or a film is referred to as being "on" or "under" another panel, another bar, another frame, another substrate, another groove, or another film, it can be "directly" or "indirectly" on the other panel, the other bar, the other frame, the other substrate, the other groove, or the other film, or one or more intervening layers may also be present. Such a position of the layer has been described with reference to the drawings.

The size of the elements shown in the drawings may be exaggerated for the purpose of explanation and may not utterly reflect the actual size.

Figure 2:
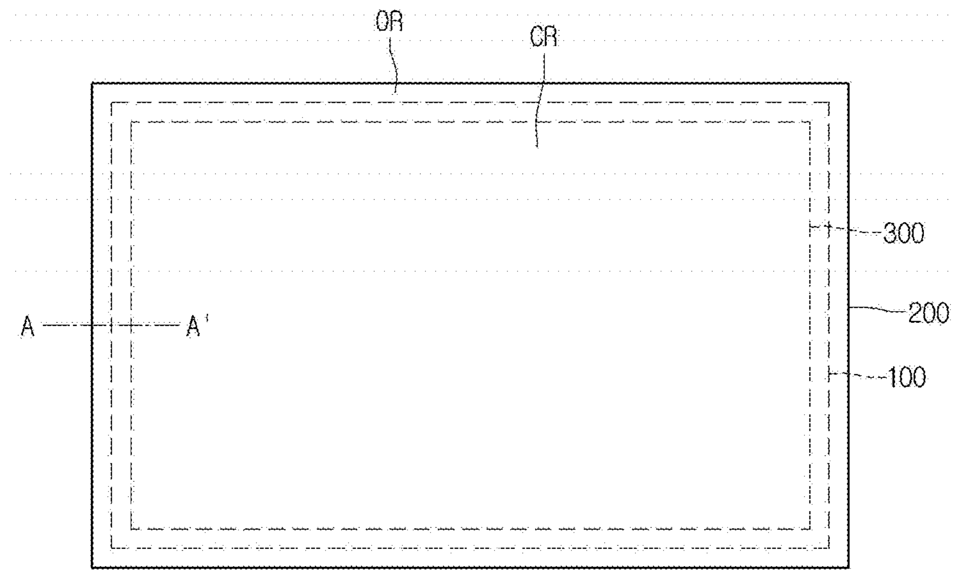
FIG. 2 is a plan view of a solar cell apparatus according to the embodiment.
Figure 3:
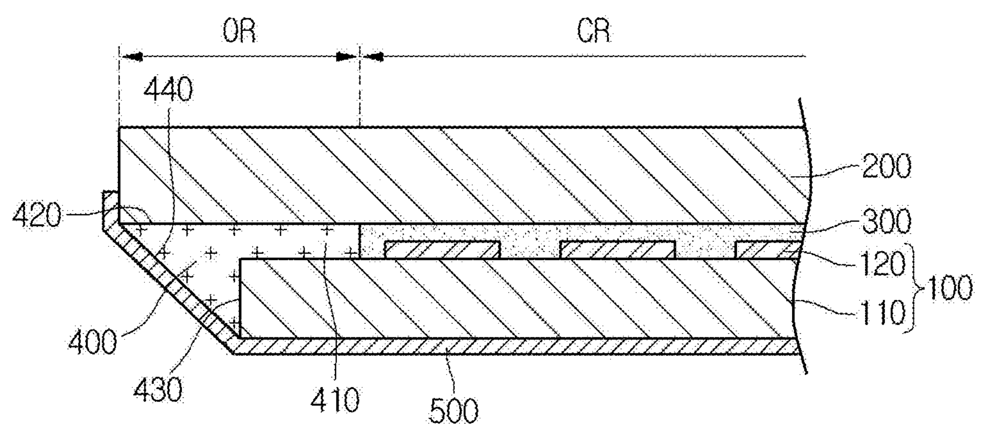
FIG. 3 is a sectional view taken along line A-A' of FIG. 2.
Figure 4:
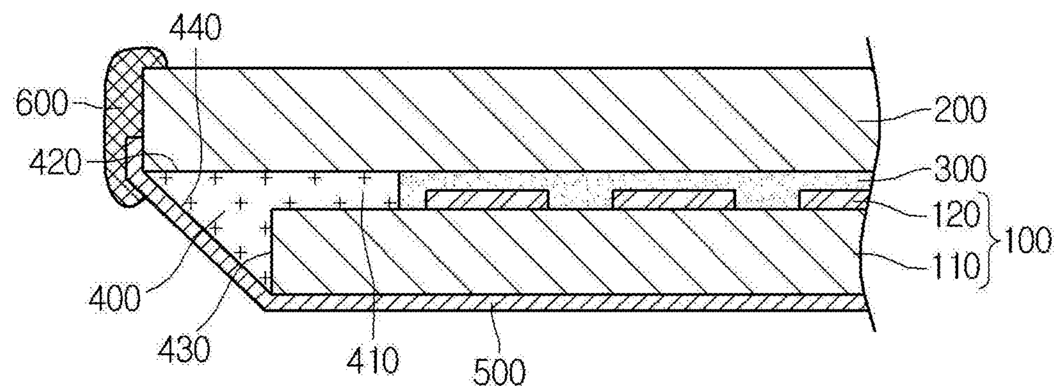
FIG. 4 is a sectional view of a solar cell apparatus according to another embodiment.
Figure 5:
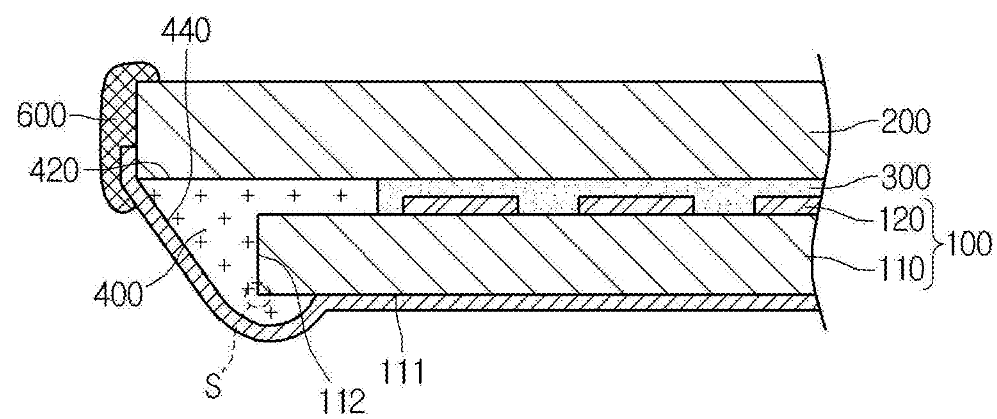
FIG. 5 is a sectional view of a solar cell apparatus according to still another embodiment.
Figure 6:
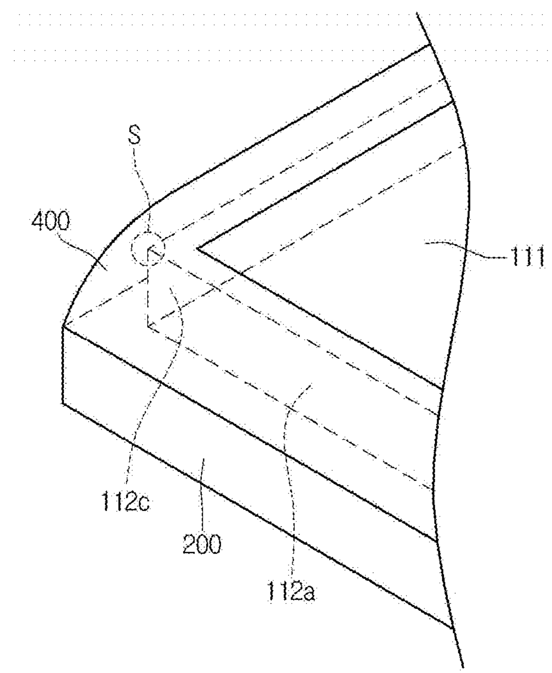
FIG. 6 is a perspective view showing a part of a bottom surface of a solar cell apparatus according to still another embodiment.
Figure 7:
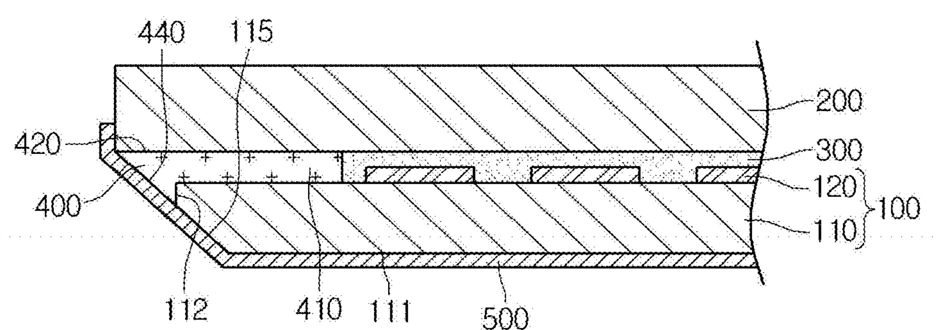
FIG. 7 is a sectional view of a solar cell apparatus according to still another embodiment.

FIG. 1 is an exploded perspective view of a solar cell apparatus according to the embodiment, FIG. 2 is a plan view of the solar cell apparatus according to the embodiment, FIG. 3 is a sectional view taken along line A-A' of FIG. 2, FIG. 4 is a sectional view of a solar cell apparatus according to another embodiment, FIG. 5 is a sectional view of a solar cell apparatus according to still another embodiment, FIG. 6 is a perspective view showing a part of a bottom surface of a solar cell apparatus according to still another embodiment, and FIG. 7 is a sectional view of a solar cell apparatus according to still another embodiment.

Referring to FIGS. 1 to 7, a solar cell module according to the embodiment includes a solar cell panel 100, a protective substrate 200, a buffer sheet 400, a sealing member 400 and a protective sheet 500.

The solar cell panel 100 has a plate shape. The solar cell panel 100 includes a support substrate 110 and a plurality of solar cells 120.

The support substrate 110 is an insulator. The support substrate 110 may be a glass substrate or a plastic substrate. The support substrate 110 has a plate shape. The support substrate 100 is flexible or rigid.

The solar cells 120 are disposed on the support substrate 110.

For instance, the solar cells may be CIGS solar cells, silicon solar cells, dye-sensitized solar cells, group II-VI compound semiconductor solar cells or group III-V compound semiconductor solar cells.

The solar cells 120 can be arranged in the form of a stripe. In addition, the solar cells 120 can be arranged in the form of a matrix. The solar cells 120 can be variously arranged. The solar cells 120 can be connected with each other in series and/or parallel.

The protective substrate 200 is disposed on the solar cell panel 100. In detail, the protective substrate 200 is disposed in opposition to the solar cell panel 100.

The protective substrate 200 is transparent and has high strength. For instance, the protective substrate 200 can be formed by using tempered glass.

As shown in FIGS. 2 and 3, the protective substrate 200 includes a central region CR and an outer region OR.

The central region CR is located at the center of the protective substrate 200. The central region CR may have a rectangular shape.

The outer region OR is located around the central region CR. The outer region OR extends along an outer peripheral portion of the central region CR. The outer region OR surrounds the outer peripheral portion of the central region CR. The outer region OR may have a closed-loop shape. The outer region OR corresponds to an outer portion of the protective substrate 200. In addition, the outer region OR corresponds to an outer portion of the solar cell panel 100.

A width of the outer region OR is smaller than a width of the central region CR. For instance, the width of the outer region OR is in the range of about 1 mm to about 15 mm.

The solar cell panel 100 is disposed in the central region CR. The solar cell panel 100 is located corresponding to the central region CR. In more detail, the central region CR is defined by the solar cell panel 100. That is, the central region CR matches with the solar cell panel 100.

Thus, a step difference is formed between the solar cell panel 100 and the protective substrate 200. The solar cell panel 100 is disposed at the bottom surface of the protective substrate 200 such that the bottom surface of the protective substrate 200 can be partially exposed. At this time, the solar cell panel 100 may expose the outer region OR in the bottom surface of the protective substrate 200.

The outer region OR is located between an outer portion of the protective substrate 200 and an outer portion of the solar cell panel 100. That is, the outer portion of the solar cell panel 100 is disposed inward with respect to the outer portion of the protective substrate 200. In detail, a surface area of the solar cell panel 100 is smaller than a surface area of the protective substrate 200, so the protective substrate 200 can cover an entire surface of the solar cell panel 100.

The buffer sheet 300 is interposed between the protective substrate 200 and the solar cell panel 100. The buffer sheet 300 protects the solar cell panel 100 from external physical impact. In addition, the buffer sheet 300 may inhibit the protective substrate 200 from directly colliding with the solar cell panel 100.

Further, the buffer sheet 300 may cover the solar cells 120. The buffer sheet 300 can seal the solar cells 120 from the outside. The buffer sheet 300 can protect the solar cells 120 from external chemical impact.

The buffer sheet 300 may have an anti-reflection function such that a greater amount of light can be incident into the solar cell panel 100.

The buffer sheet 300 may include an insulator. In detail, the buffer sheet 300 can be formed by using an insulator. For instance, the buffer sheet 300 may include ethylenevinylacetate (EVA) resin. That is, the buffer sheet 300 is an insulating layer.

The buffer sheet 300 has an improved optical characteristic. For instance, the buffer sheet 300 has the transmittance higher than that of the sealing member 400.

The buffer sheet 300 is disposed within the outer portion of the solar cell panel 100. That is, the outer portion of the buffer sheet 300 is disposed inward with respect to the outer portion of the solar cell panel 100. A surface area of the buffer sheet 300 is smaller than a surface area of the solar cell panel 100.

The sealing member 400 is disposed at the lateral side of the solar cell panel 100 and the bottom surface of the protective substrate 200. The sealing member is disposed in the outer region OR. The sealing member 400 is disposed around the solar cell panel 100.

The sealing member 400 is disposed in the outer region OR of the protective substrate 200. The sealing member 400 extends along the outer region OR. The sealing member 400 directly makes contact with the outer region OR. In detail, sealing member 400 directly makes contact with the bottom surface of the outer region OR.

In addition, the sealing member 400 directly makes contact with the lateral side of the solar cell panel 100. The solar cell panel 100 includes four lateral sides. In detail, the solar cell panel 100 includes a first lateral side **112*a* and a second lateral side, which are opposite to each other. Further, the solar cell panel 100 includes a third lateral side 112*c* and a fourth lateral side, which are opposite to each other. The third lateral side 112*c* extends from the first lateral side 112*a* toward the second lateral side and the fourth lateral side extends from the first lateral side 112*a*** toward the second lateral side.

The sealing member 400 may be disposed over the first lateral side **112*a*, the second lateral side, the third lateral side 112*c* and the fourth lateral side. The sealing member 400 can make contact with the first lateral side 112*a*, the second lateral side, the third lateral side 112*c*** and the fourth lateral side.

Further, a part of the sealing member 400 is inserted between the protective substrate 200 and the solar cell panel 100. That is, the sealing member 400 may include an insertion part 410 inserted between the protective substrate 200 and the solar cell panel 100. The insertion part 410 can directly make contact with the buffer sheet 300.

The sealing member 400 may include a horizontal surface 420, a vertical surface 430 and an inclined surface 440.

The horizontal surface 420 directly makes contact with the bottom surface of the protective substrate 200. The vertical surface 430 directly makes contact with the lateral side 112 of the solar cell panel 100. The inclined surface 440 extends from the horizontal surface 420 to the vertical surface 430. In addition, the inclined surface 440 is inclined with respect to the horizontal surface 420 and the vertical surface 430.

For instance, the sealing member 400 may include butyl rubber, polypropylene or polyvinylchloride.

The sealing member 400 may have superior moisture-barrier property. That is, the sealing member 400 may have low moisture permeability. In detail, the sealing member may have moisture permeability lower than that of the buffer sheet 300.

The sealing member 400 seals between the solar cell panel 100 and the protective substrate 200. The sealing member 400 can be securely combined to outer portions of the solar cell panel 100 and the protective substrate 200.

The solar cell panel 100 is disposed on the bottom surface of the protective substrate 200 while forming a stepped portion therebetween and the sealing member 400 is disposed at the stepped portion. At this time, the sealing member 400 can seal between the solar cell panel 100 and the protective substrate 200 while directly making contact with the lateral side of the solar cell panel 100 and the bottom surface of the protective substrate 200.

Therefore, the moisture penetration into the region between the solar cell panel 100 and the protective substrate 200 can be effectively inhibited. That is, since the sealing member 400 makes contact with the lateral side of the solar cell panel 100 as well as the top surface of the solar cell panel 100, the contact area between the sealing member 400 and the solar cell panel 100 can be increased. In addition, since the sealing member 400 is disposed in the outer region OR, the contact area between the sealing member and the protective substrate 200 can be increased.

As a result, the moisture penetration into the region between the sealing member 400 and the solar cell panel 100 can be effectively inhibited. In addition, the moisture penetration into the region between the sealing member 400 and the protective substrate 200 can be effectively inhibited.

The protective sheet 500 is disposed under the solar cell panel 100. The protective sheet 500 covers the bottom surface 111 of the solar cell panel 100. In addition, the protective sheet 500 covers the sealing member 400. The protective sheet 500 covers the entire area of the bottom surface 111 of the solar cell panel 100. The protective sheet 500 may extend from the bottom surface 111 of the solar cell panel 100 to the lateral side of the protective substrate 200.

In addition, the protective sheet 500 directly makes contact with the sealing member 400. In detail, the protective sheet 500 covers the inclined surface 440 of the sealing member 400. The protective sheet 500 directly makes contact with the inclined surface 440 of the sealing member 400.

The protective sheet 500 is an insulator. The protective sheet 500 has a hydrophobic property. The protective sheet 500 may include a thermoplastic resin. The protective sheet 500 may include polyethylene (PE), fluorocarbon or poly (tetrafluoroethylene).

Since the protective sheet 500 covers the sealing member 400, the moisture-penetration from the outside can be effectively inhibited. In particular, since the protective sheet 500 covers the inclined surface 440 of the sealing member 400, the protective sheet 500 can cover the sealing member 400 without forming a great step difference. That is, the protective sheet 500 may not be greatly bent when the protective sheet 500 covers the sealing member 400.

As a result, the protective sheet 500 may not be delaminated from the sealing member 400 and the protective sheet 500 can effectively inhibit the moisture-penetration into the region between the solar cell panel 100 and the protective substrate 200.

The solar cell apparatus according to the embodiment may further include a junction box. The junction box is disposed under the solar cell panel 100. The junction box receives devices for driving the solar cell panel 100. For instance, the junction box may receive bypass diodes therein. That is, the junction box is a receptacle for receiving the devices.

In addition, the solar cell apparatus according to the embodiment may further include two bus bars connected to the outermost solar cells, respectively. In addition, the solar cell apparatus according to the embodiment may further include connection wires connected to the bus bars, respectively.

Referring to FIG. 4, the solar cell apparatus according to the embodiment may further include a buffer tape 600. The buffer tape 600 is disposed at the lateral side of the protective substrate 200. The buffer tape 600 may surround the lateral side of the protective substrate 200. The buffer tape 600 may cover an edge portion of the protective substrate 200. In addition, the buffer tape 600 may cover a part of the protective sheet 500.

The buffer tape 600 can be formed by using an elastic resin. The buffer tape 600 can protect the lateral side and the edge portion of the protective substrate 200 from the external impact. For instance, the buffer tape 600 may include a rubber resin.

In addition, since the buffer tape 600 covers the protective sheet 500, the moisture-penetration into the region between the protective sheet 500 and the protective substrate 200 can be inhibited.

Referring to FIGS. 5 and 6, the sealing member 400 can be disposed at the bottom surface of the solar cell panel 100. That is, the sealing member 400 can be disposed over the lateral side and the bottom surface of the solar cell panel 100.

At this time, the sealing member 400 can cover an edge region S of the solar cell panel 100. That is, the sealing member 400 can cover a region where the lateral side 112 of the solar cell panel 100 meets the bottom surface 111 of the solar cell panel 100.

In addition, as shown in FIG. 6, the sealing member 400 can cover a region S where the first lateral side **112*a*, the third lateral side 112*c* and the bottom surface of the solar cell panel 100** are met with each other.

In this manner, the sealing member 400 covers the edge region S of the solar cell panel 100 to protect the solar cell panel 100. That is, the sealing member 400 can inhibit the outer portion of the solar cell panel 100 from being broken.

In addition, the sealing member 400 can inhibit the protective sheet 500 from directly making contact with the edge portion S of the solar cell panel 100. Thus, the sealing member 400 can inhibit the protective sheet 500 from being damaged by the edge portion S of the solar cell panel 100.

Referring to FIG. 7, the solar cell panel 100 may have an inclined structure. In detail, the support substrate 110 of the solar cell panel 100 may have an inclined structure. The solar cell panel 100 may include an inclined portion extending from the lateral side to the bottom surface of the solar cell panel 100.

The inclined portion 115 is inclined with respect to the lateral side of the solar cell panel 100. In addition, the inclined portion 115 is inclined with respect to the bottom surface of the solar cell panel 100.

Therefore, the protective sheet 500 is smoothly curved and directly makes contact with the sealing member 400. That is, the protective sheet 500 is disposed over the bottom surface of the solar cell panel 100, the inclined surface 115 of the solar cell panel 100 and the sealing member 400. At this time, since the inclined portion 115 is inclined with respect to the bottom surface of the solar cell panel 100, the protective sheet is smoothly curved.

Thus, the protective sheet 500 can be inhibited from being delaminated from the sealing member 400 caused by the elasticity of the protective sheet 500.

The solar cell apparatus according to the embodiment can be fabricated through the following method.

First, the buffer sheet 300 is laminated on the solar cell panel 100. Then, the protective substrate 200 is combined onto the buffer sheet 300. At this time, since the buffer sheet 300 has the surface area smaller than that of the solar cell panel 100, a gap may be formed between the protective substrate 200 and the solar cell panel 100.

After that, resin composition is coated around the solar cell panel 100 and on the bottom surface of the protective substrate 200. The resin composition can be injected into the gap between the protective substrate 200 and the solar cell panel 100 due to capillary phenomenon.

Then, the resin composition is cured or cooled to form the sealing member 400. If the resin composition includes a curable resin, the sealing member 400 may be formed through the photo-curing and/or thermal curing. If the resin composition includes a thermoplastic resin, the resin composition is melted by heat and then cooled to form the sealing member 400.

After that, the protective sheet 500 is laminated on the bottom surface of the solar cell panel 100 and the sealing member 400, so that the solar cell apparatus according to the embodiment is fabricated.

As described above, according to the solar cell apparatus of the embodiment, the space between the solar cell panel 100 and the protective substrate 200 can be effectively sealed by the sealing member 400, the protective sheet 500 and the buffer tape 600.

Therefore, the solar cell apparatus according to the embodiment may have the improved reliability and durability. In addition, the solar cell apparatus according to the embodiment can inhibit the performance degradation while improving the efficiency thereof.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effects such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell apparatus comprising:

a protective substrate including a central region and an outer region surrounding the central region;

a solar cell panel disposed in the central region at a bottom surface of the protective substrate;

a buffer sheet disposed only between the protective substrate and the solar cell panel;

a sealing member surrounding a lateral side of the solar cell panel and disposed in the outer region, wherein a part of the sealing member is inserted between the protective substrate and the solar cell panel; and a protective sheet covering the bottom surface of the solar cell panel and an inclined surface of the sealing member;

wherein the sealing member is disposed only between the protective substrate and the solar cell panel, wherein the buffer sheet and the sealing member are formed by using different materials, wherein the sealing member has a moisture permeability lower than that of the buffer sheet, wherein the protective sheet covers a lateral side of the protective substrate;

wherein the sealing member comprises:

a horizontal surface directly making contact with the bottom surface of the protective substrate; and a vertical surface directly making contact with the lateral side of the solar cell panel;

wherein the inclined surface of the sealing member extends from the horizontal surface to the vertical surface;

wherein the solar cell panel comprises:

a lateral side at which the sealing member is disposed; and a first inclined surface extending from the lateral side to a bottom surface of the solar cell panel and inclined with respect to the lateral side;

wherein the protective sheet comprises a second inclined surface;

wherein the second inclined surface of the protective sheet is inclined to correspond with the first inclined surface of the solar cell panel;

wherein the sealing member makes direct contact with the lateral side of the solar cell panel, and the sealing member makes direct contact with the bottom surface of the protective substrate;

wherein the part of the sealing member directly makes contact with the buffer sheet, and wherein a surface area of the solar cell panel is smaller than a surface area of the protective substrate.

2. The solar cell apparatus of claim 1, wherein the sealing member includes polypropylene, polyvinylchloride or butyl rubber resin.

3. The solar cell apparatus of claim 2, wherein the buffer sheet includes ethylenevinylacetate.

4. A solar cell apparatus comprising:

a protective substrate;

a solar cell panel under the protective substrate;

a buffer sheet interposed only between the protective substrate and the solar cell panel;

a sealing member disposed at a lateral side of the solar cell panel, on a bottom surface of the protective substrate and between the solar cell panel and the protective substrate; and a protective sheet disposed under the solar cell panel;

wherein an outer portion of the solar cell panel is located inward with respect to an outer portion of the protective substrate;

wherein an outer portion of the buffer sheet is located inward with respect to the outer portion of the solar cell panel;

wherein the sealing member surrounds the solar cell panel;

wherein the protective sheet extends from a bottom surface of the solar cell panel to a lateral side of the protective substrate;

wherein the solar cell panel includes a support substrate and a plurality of solar cells;

wherein the support substrate comprises a first inclined surface;

wherein the protective sheet makes direct contact with the first inclined surface;

wherein the protective sheet comprises a second inclined surface;

wherein the second inclined surface of the protective sheet is inclined to correspond with the first inclined surface of the support substrate;

wherein one surface of the sealing member makes direct contact with the second inclined surface of the protective sheet, and another surface of the sealing member is in direct contact with the buffer sheet;

wherein a thickness of the central region of the support substrate is greater than a thickness of the outer region, wherein the sealing member is disposed only between the protective substrate and the solar cell panel, wherein the buffer sheet and the sealing member are formed by using different materials, wherein the sealing member has a moisture permeability lower than that of the buffer sheet, and wherein a surface area of the solar cell panel is smaller than a surface area of the protective substrate.

5. The solar cell apparatus of claim 4, wherein the buffer sheet has light transmittance higher than light transmittance of the sealing member.

* * * * *